US010547001B2

(12) United States Patent
Kang et al.

(10) Patent No.: US 10,547,001 B2
(45) Date of Patent: Jan. 28, 2020

(54) ELECTRONIC DEVICE AND METHOD FOR FABRICATING THE SAME

(71) Applicant: SK hynix Inc., Icheon (KR)

(72) Inventors: Dae-Gun Kang, Icheon (KR); Su-Jin Chae, Icheon (KR); Sung-Kyu Min, Seoul (KR); Myoung-Sub Kim, Seongnam (KR); Chi-Ho Kim, Yongin (KR); Su-Yeon Lee, Cheongju (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 15/878,257

(22) Filed: Jan. 23, 2018

(65) Prior Publication Data

US 2018/0358556 A1 Dec. 13, 2018

(30) Foreign Application Priority Data

Jun. 8, 2017 (KR) .................. 10-2017-0071420

(51) Int. Cl.
*H01L 29/02* (2006.01)
*H01L 45/00* (2006.01)
*H01L 27/24* (2006.01)

(52) U.S. Cl.
CPC ...... *H01L 45/1293* (2013.01); *H01L 27/2409* (2013.01); *H01L 27/2463* (2013.01); *H01L 45/06* (2013.01); *H01L 45/08* (2013.01); *H01L 45/1233* (2013.01); *H01L 45/16* (2013.01)

(58) Field of Classification Search
CPC ............ H01L 27/2409; H01L 27/2427; H01L 27/2463; H01L 45/04; H01L 45/06
USPC .................................................. 257/2, 5
See application file for complete search history.

(56) References Cited

U.S. PATENT DOCUMENTS

| 8,569,731 B2* | 10/2013 | Konno | H01L 21/76224 |
| | | | 257/4 |
| 9,634,008 B2* | 4/2017 | Okano | H01L 27/092 |
| 2012/0269989 A1 | 10/2012 | Liang et al. | |
| 2015/0179501 A1 | 6/2015 | Jhaveri et al. | |
| 2018/0166559 A1* | 6/2018 | Zhou | H01L 29/66666 |

FOREIGN PATENT DOCUMENTS

| KR | 10-2012-0043073 A | 5/2012 |
| KR | 10-2012-099243 A | 9/2012 |
| KR | 10-2015-0126874 A | 11/2015 |

* cited by examiner

*Primary Examiner* — Tan N Tran

(57) ABSTRACT

An electronic device may include a semiconductor memory, and the semiconductor memory may include a plurality of memory cells each including a variable resistance layer; a substituted dielectric layer filling a space between the plurality of memory cells; and an unsubstituted dielectric layer disposed adjacent to the variable resistance layer of each of the plurality of memory cells, wherein the unsubstituted dielectric layer may include a flowable dielectric material.

7 Claims, 10 Drawing Sheets

ELECTRONIC DEVICE AND METHOD FOR FABRICATING THE SAME

CROSS-REFERENCE TO RELATED APPLICATION

This patent document claims priority to Korean Patent Application No. 10-2017-0071420, filed on Jun. 8, 2017, which is incorporated herein by reference in its entirety.

TECHNICAL FIELD

This patent document relates to memory circuits or devices, methods for fabricating the same and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory which can improve characteristics of a variable resistance element.

In one aspect, an electronic device may include a semiconductor memory, and the semiconductor memory may include a plurality of memory cells each including a variable resistance layer; a substituted dielectric layer filling a space between the plurality of memory cells; and an unsubstituted dielectric layer disposed adjacent to the variable resistance layer of each of the plurality of memory cells, wherein the unsubstituted dielectric layer may include a flowable dielectric material.

Implementations of the above electronic device may include one or more the following.

The substituted dielectric layer may include Si—O bonds, and the unsubstituted dielectric layer includes Si—N bonds, Si—H bonds, or both, and the space between the plurality of memory cells may include a plurality of trenches, each of the trenches being disposed between neighboring memory cells. The substituted dielectric layer may include $SiO_2$, and the unsubstituted dielectric layer may include silazane $((SiH_2NH)_n)$. Each of the plurality of memory cells may include a material having a variable resistance characteristic, the material being a phase-change material or including a metal oxide. Each of the memory cells may further include a selection element layer controlling access to the variable resistance layer. The semiconductor memory may further include a capping layer disposed on at least a side surface of one or more of the memory cells. The semiconductor memory may further include: a plurality of first lines disposed over a substrate and under the memory cells, each of the plurality of lines extending in a first direction; and a plurality of second lines disposed over the memory cells, each of the plurality of second lines extending in a second direction that crosses the first direction, and the plurality of memory cells may be located at respective intersections of the first lines and the second lines.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device may include a semiconductor memory, and the semiconductor memory may include a plurality of memory cells each including a variable resistance layer; a first dielectric layer filling a space between the plurality of memory cells; and a second dielectric layer disposed adjacent to a portion of a side surface of the variable resistance layer of each of the plurality of memory cells, wherein the second dielectric layer may have a higher porosity than the first dielectric layer.

Implementations of the above electronic device may include one or more the following.

The first dielectric layer may include Si—O bonds, and the second dielectric layer includes Si—N bonds, Si—H bonds, or both, and the space between the plurality of memory cells may include a plurality of trenches, each of the trenches being disposed between neighboring memory cells. The first dielectric layer may include $SiO_2$, and the second dielectric layer may include silazane $((SiH_2NH)_n)$. Each of the plurality of memory cells may include a material having a variable resistance characteristic, the material being a phase-change material or including a metal oxide. Each of the memory cells may further include a selection element layer controlling access to the variable resistance layer. The semiconductor memory may further include a capping layer disposed on at least a side surface of one or more of the memory cells. The semiconductor memory may further include: a plurality of first lines disposed over a substrate and under the memory cells, each of the plurality of first lines extending in a first direction; and a plurality of second lines disposed over the memory cells, each of the plurality of second lines extending in a second direction that crosses the first direction, and the plurality of memory cells may be located at respective intersections of the first lines and the second lines.

In further another aspect, an electronic device may include a semiconductor memory, and the semiconductor memory may include a plurality of memory cells each including a variable resistance layer; a first dielectric layer filling a space between the plurality of memory cells and including an element; and a second dielectric layer disposed adjacent to a portion of a side surface of the variable resistance layer of each of the plurality of memory cells, wherein the second dielectric layer may include the element of the first dielectric layer, and have a lower thermal conductivity than the first dielectric layer.

Implementations of the above electronic device may include one or more the following.

The first dielectric layer may include Si—O bonds, and the second dielectric layer may include Si—N bonds, Si—H bonds, or both, and the space between the plurality of memory cells may include a plurality of trenches, each of the trenches being disposed between neighboring memory cells. The first dielectric layer may include $SiO_2$, and the second dielectric layer may include silazane $((SiH_2NH)_n)$. Each of the plurality of memory cells may include a material having a variable resistance characteristic, the material being a phase-change material or including a metal oxide. Each of the memory cells may further include a selection element layer controlling access to the variable resistance layer. The semiconductor memory may further include a capping layer disposed on at least a side surface of one or more of the memory cells. The semiconductor memory may further include: a plurality of first lines disposed over a substrate and under the memory cells, each of the plurality of first lines extending in a first direction; and a plurality of second lines disposed over the memory cells, each of the plurality of second lines extending in a second direction that crosses the first direction, wherein the plurality of memory cells may be located at respective intersections of the first lines and the second lines.

In still another aspect, a method for fabricating an electronic device including a semiconductor memory may include: forming a plurality of memory cells over a substrate, each of the plurality of memory cells including a variable resistance layer; filling a space between the plurality of memory cells by forming a flowable dielectric layer; and converting a first portion of the flowable dielectric layer into a dielectric material layer by curing the first portion of the flowable dielectric layer, the dielectric material layer including a first dielectric layer, a second portion of the flowable dielectric layer including a second dielectric layer, the second dielectric layer being disposed adjacent to a portion of a side surface of the variable resistance layer of each of the plurality of memory cells, the second portion of the flowable dielectric layer being uncured.

Implementations of the above method for fabricating the electronic device may include one or more the following.

The forming the flowable dielectric layer may include performing a flowable chemical vapor deposition process using one or more materials having Si—N bonds, Si—H bonds, or both. The flowable dielectric layer may be formed using one or more silicon-containing compounds, each of the silicon-containing compounds being selected from the group consisting of trisilylamine (TSA), tetraoxymethylcyclotetrasiloxane (TOMCTS), octamethylcyclotetrasiloxane (OMCTS), tetraethoxysilane (TEOS), triethoxysilane (TES), trimethylsilane (TMS), methyltriethoxysilane (MTEOS), tetramethylorthosilicate (TMOS), methyltrimethoxysilane (MTMOS), dimethyldimethoxysilane (DMDMOS), diethoxysilane (DES), triphenylethoxysilane, 1-(triethoxysilyl)-2-(diethoxymethylsilyl)ethane, tri-t-butoxylsilanol, and tetramethoxysilane. The flowable dielectric layer may include silazane $((SiH_2NH)_n)$. Curing the flowable dielectric layer may include one or both of thermally annealing the flowable dielectric layer and exposing the flowable dielectric layer to plasma using $O_2$, $O_3$, or a mixture thereof. The first dielectric layer may be formed by curing the flowable dielectric layer and planarizing the dielectric material layer, the first dielectric layer including Si—O bonds. The first dielectric layer may include $SiO_2$. The location of the second dielectric layer may be controlled by adjusting one or more conditions, each of the conditions being selected from the group consisting of a dimension of the memory cells, a thickness of the flowable dielectric layer, deposition conditions of the flowable dielectric layer, and process conditions of the curing. Each of the plurality of memory cells may include a material having a variable resistance characteristic, the material being a phase-change material or including a metal oxide.

In still another aspect, a method for fabricating an electronic device including a semiconductor memory may include: providing a substrate including a first portion in a first region and a second portion in a second region adjacent to the first region; forming a plurality of memory cells over the first portion of the substrate in the first region, each of the plurality of memory cells including a variable resistance layer; forming a flowable dielectric layer over the plurality of memory cells and the substrate, a top surface of a first portion of the flowable dielectric layer in the first region being disposed at a first distance from a top surface of the substrate, the first distance being greater than a second distance of a top surface of a second portion of the flowable dielectric layer in the second region from the top surface of the substrate; converting a first portion of the flowable dielectric layer into a dielectric material layer by curing the first portion of the flowable dielectric layer, the dielectric material layer including a first dielectric layer, a second portion of the flowable dielectric layer being a second dielectric layer, the second dielectric layer being disposed adjacent to a portion of a side surface of variable resistance layer of each of the plurality of memory cells, the second portion of the flowable dielectric layer being uncured; and removing a portion of the dielectric material layer in the second region.

Implementations of the above method for fabricating the electronic device may include one or more the following.

The method may further include forming an interlayer dielectric material layer over the plurality of memory cells, and planarizing the interlayer dielectric material layer until top surfaces of the memory cells are exposed. The method may further include, before the plurality of memory cells are formed, forming a plurality of first lines over the substrate and under the memory cells in the first region, each of the plurality of first lines extending in a first direction; and forming a plurality of second lines being in contact with the memory cells after the planarization of the interlayer dielectric material layer is performed, each of the plurality of second lines extending in a second direction that crosses the first direction. The portion of the dielectric material layer in the second region may be removed by a wet etch process. The forming of the flowable dielectric layer may include performing a flowable chemical vapor deposition process using one or more materials having Si—N bonds, Si—H bonds, or both. The forming of the flowable dielectric layer may be performed using one or more silicon-containing compounds, each of silicon-containing compounds being selected from the group consisting of trisilylamine (TSA), tetraoxymethylcyclotetrasiloxane (TOMCTS), octamethylcyclotetrasiloxane (OMCTS), tetraethoxysilane (TEOS), triethoxysilane (TES), trimethylsilane (TMS), methyltriethoxysilane (MTEOS), tetramethylorthosilicate (TMOS), nnethyltrimethoxysilane (MTMOS), dimethyldimethoxysilane (DMDMOS), diethoxysilane (DES), triphenylethoxysilane, 1-(triethoxysilyl)-2-(diethoxymethylsilyl)ethane, tri-t-butoxylsilanol, and tetramethoxysilane. The flowable dielectric layer may include silazane $((SiH_2NH)_n)$. The curing of the flowable dielectric layer may include one or both of thermally annealing the flowable dielectric layer and exposing the flowable dielectric layer to plasma using $O_2$, $O_3$, or a mixture thereof. The first dielectric layer may be formed by removing a portion of the dielectric material layer in the first region, the first dielectric layer including Si—O bonds. The first dielectric layer may include $SiO_2$. A location of the second dielectric layer may be controlled by adjusting one or more conditions, each of the conditions being selected from the group consisting of a dimension of the memory cells, a thickness of the flowable dielectric layer, deposition conditions of the flowable dielectric layer, and process conditions of the curing. Each of the memory cells may include a material having a variable resistance characteristic, the material being a phase-change material or including a metal oxide.

These and other aspects, implementations and associated advantages are described in greater detail in the drawings, the description and the claims.

DETAILED DESCRIPTION

Figure 1:
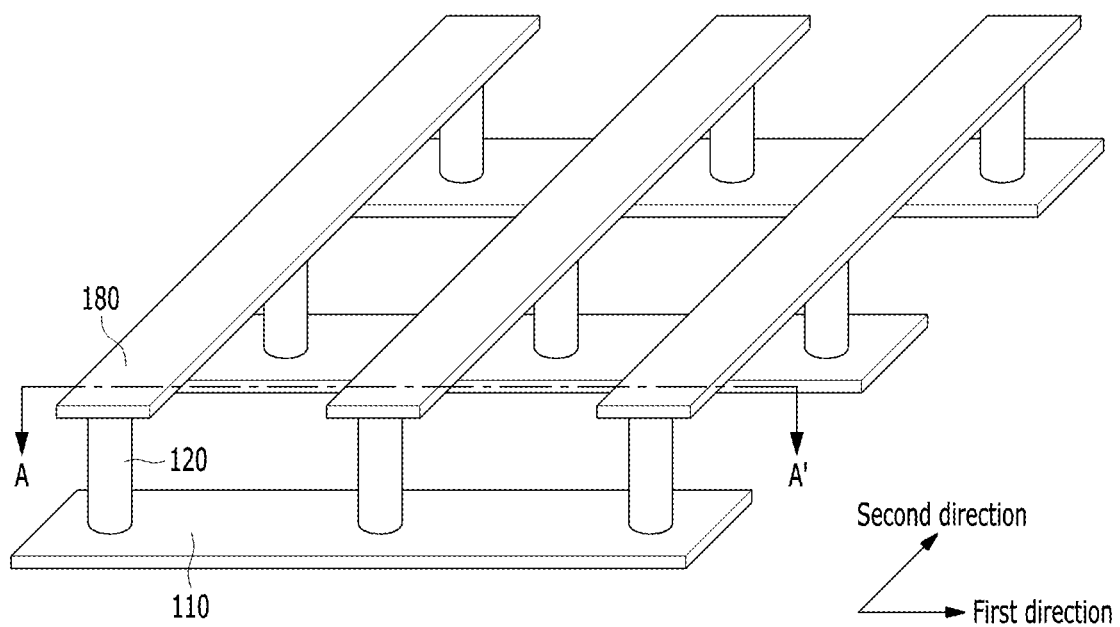
FIG. 1 is a perspective view of a semiconductor memory in accordance with an implementation of the present disclosure.

Various examples and implementations of the disclosed technology are described below in detail with reference to the accompanying drawings.

The drawings may not necessarily be to scale. In some instances, proportions of at least some of the substrates in the drawings may be exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example, and a different relative positioning relationship or sequence of arranging the layers may be possible. In addition, a described or illustrated example of a multi-layer substrate may not reflect all layers present in that particular multi-layer substrate (e.g., one or more additional layers may be present between two illustrated layers). As a specific example, when a first layer in a described or illustrated multi-layer substrate is referred to as being "on" or "over" a second layer or "on" or "over" a substrate, the first layer may be directly formed on the second layer or the substrate but may also represent a substrate where one or more other intermediate layers may exist between the first layer and the second layer or the substrate.

FIG. 1 is a perspective view of a semiconductor memory in accordance with an implementation of the present disclosure.

Referring to FIG. 1, the semiconductor memory in accordance with the implementation of the present disclosure may have a cross-point structure which includes first lines 110 extending in a first direction, second lines 180 located over the first lines 110 and extending in a second direction crossing the first direction, and memory cells 120 located between the first lines 110 and the second lines 180. The memory cells 120 are disposed at respective intersections of the first lines 110 and the second lines 180.

FIGS. 2A, 2B, 2C, 2D, and 2E are cross-sectional views taken along line A-A' of FIG. 1.

Specifically, FIGS. 2A to 2E are cross-sectional views illustrating a semiconductor memory and a method for fabricating the semiconductor memory in accordance with an implementation of the present disclosure.

First, the method for fabricating the semiconductor device will be explained below.

Figure 2A:
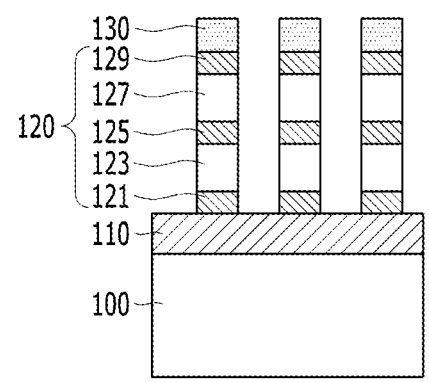
FIGS. 2A, 2B, 2C, 2D, and 2E are cross-sectional views illustrating a semiconductor memory and a method for fabricating the semiconductor memory in accordance with an implementation of the present disclosure.

Referring to FIG. 2A, a substrate 100 including given structures (not shown) may be provided. For example, the given structures may include a transistor for controlling the first lines 110 and/or the second lines 180 of FIGS. 1 and/or 2E, which are formed over the substrate 100.

Then, the first lines 110 extending in a first direction may be formed over the substrate 100. The first lines 110 may have a single-layered structure or a multi-layered structure, and may include a conductive material such as a metal, a metal nitride, etc. The first lines 110 may be formed by depositing a layer that includes the conductive material and patterning the deposited layer. Spaces between the first lines 110 may be filled with an insulating material (not shown).

Then, a plurality of memory cells 120 may be formed over the first lines 110. In the implementation shown in FIG. 2A, each of the plurality of memory cells 120 may have a pillar shape. The plurality of memory cells 120 may be arranged in a matrix having rows and columns. The rows extend along the first direction and the columns extend along a second direction crossing the first direction.

The memory cells 120 may be disposed in intersection regions between the first lines 110 and second lines 170. An intersection region between one of the first lines 110 and one of the second lines 170 is defined, for example, as a three-dimensional region where the first line 110 overlaps the second line 170 in a third direction that crosses the first and second directions. In an implementation, each of the memory cells 120 may have a size that is equal to or smaller than that of the intersection region between each corresponding pair of the first lines 110 and the second lines 180. In another implementation, each of the memory cells 120 may have a size that is larger than that of the intersection region between each corresponding pair of the first lines 110 and the second lines 180.

The memory cells 120 may be formed by depositing a plurality of material layers (not shown) over a structure including the first lines 110 and the insulating material (not shown), forming a plurality of hard mask patterns 130 over the material layers, and etching the material layers using the hard mask patterns 130 as an etching barrier. Therefore, each of the hard mask patterns 130 has sidewalls aligned with sidewalls of each of the corresponding memory cells 120.

The hard mask patterns 130 may function as an etching barrier during etching the material layers (not shown) for forming the memory cells 120, and include one or more of various materials capable of securing etch selectivity with respect to the memory cells 120. For example, each of the hard mask patterns 130 may have a single-layered structure or a multi-layered structure and include an insulating material such as a silicon oxide, a silicon nitride, a silicon oxynitride, etc.

Also, in this implementation, each of the plurality of memory cells 120 may include a lower electrode layer 121, a selection element layer 123, a middle electrode layer 125, a variable resistance layer 127, and an upper electrode layer 129, which are sequentially stacked.

Specifically, the lower electrode layer 121 may be located at a lowermost portion of the memory cell 120 and function as a transmission path of a voltage or a current between a corresponding one of the first lines 110 and the rest of the memory cell 120. The middle electrode layer 125 may physically separate the selection element layer 123 from the variable resistance layer 127, and electrically couple the selection element layer 123 to the variable resistance layer 127. For example, a current flows through the selection element layer 123, the middle electrode layer 125, and the variable resistance layer 127, when a voltage level across the selection element layer 123 is equal to or greater than a given threshold voltage. The upper electrode layer 129 may be located at an uppermost portion of the memory cells 120 and function as a transmission path of a voltage or a current between the rest of the memory cell 120 and a corresponding one of the second lines 180 of FIG. 2E. Each of the lower electrode layer 121, the middle electrode layer 125, and the upper electrode layer 129 may have a single-layered structure or a multi-layered structure and include a conductive material such as a metal, a metal nitride, a conductive carbon material, etc.

The selection element layer 123 may control access to the variable resistance layer 127. That is, the selection element layer 123 may have a selection element characteristic, which substantially prevents a current from passing through the selection element layer 123 when a magnitude of an applied voltage or an applied current is lower than a critical value (or a threshold value), and causes a current to pass through the selection element layer 123 when a magnitude of the applied voltage or the applied current exceeds the critical value. For example, a magnitude of the current passing through the selection element layer 123 is proportional to a magnitude of the voltage or current applied to the selection element layer 123. The selection element layer 123 may have a single-layered structure, or a multi-layered structure that exhibits the selection element characteristic using a combination of two or more layers.

In some implementations, the selection element layer 123 may include an MIT (metal insulator transition) element, such as $NbO_2$ or $TiO_2$; an MIEC (mixed ion-electron conducting) element, such as $ZrO_2$ $(Y_2O_3)$, $Bi_2O_3$—$BaO$, or $(La_2O_3)_x(CeO_2)_{1-x}$; an OTS (ovonic threshold switching) element including a chalcogenide-based material, such as $Ge_2Sb_2Te_5$, $As_2Te_3$, $As_2$, $As_2Se_3$; or a combination thereof.

In certain implementations, the selection element layer 123 may include a tunneling dielectric layer. The tunneling dielectric layer includes one or more of various dielectric materials, such as a silicon oxide, a silicon nitride, and a metal oxide. A thickness of the tunneling dielectric layer is sufficiently small to allow tunneling of electrons under a given voltage or a given current.

The variable resistance layer 127 may switch between different resistance states according to a voltage or a current applied to the variable resistance layer 127 through the upper electrode layer 129 and the middle electrode layer 125, thereby storing data having different values. For example, when the variable resistance layer 127 is in a low resistance state, data having a first logic value of '1' may be stored in the variable resistance layer 127. On the other hand, when the variable resistance layer 127 is in a high resistance state, data having a second logic value of '0' may be stored in the variable resistance layer 127. The variable resistance layer 127 may include one or more of various materials that are used in RRAM, PRAM, FRAM, MRAM, or the like. For example, the variable resistance layer 127 may include any of metal oxides, such as transition metal oxides or perovskite-based materials; phase-change materials, such as chalcogenide-based materials; ferroelectric materials, ferromagnetic materials; and the like. The variable resistance layer 127 may have a single-layered structure, or a multi-layered structure that shows a variable resistance characteristic by a combination of two or more layers. However, other implementations are also possible. For example, the memory cell 120 may include a memory layer, which can store data in different ways than the above-described variable resistance layer 127.

In the implementation shown in FIG. 2A, each of the memory cells 120 includes the lower electrode layer 121, the selection element layer 123, the middle electrode layer 125, the variable resistance layer 127, and the upper electrode layer 129. However, implementations of the present patent document are not limited thereto, and the memory cells 120 may have various structures. In some implementations, at least one of the lower electrode layer 121, the middle electrode layer 125, and the upper electrode layer 129 may be omitted. In some implementations, the selection element layer 123 may be omitted. In some implementations, the stacked order of the selection element layer 123 and the variable resistance layer 127 may be reversed with respect to the orientation shown in FIG. 2A, such that the selection element layer 123 may be disposed over the variable resistance layer 127. In some implementations, in addition to the layers 121, 123, 125, 127, and 129 shown in FIG. 2A, the memory cells 120 may further include one or more layers (not shown) for enhancing characteristics of the memory cells 120 or improving fabricating processes.

A neighboring pair of the plurality of memory cells 120 may be spaced apart from each other at a predetermined interval, and trenches may be present between the plurality of memory cells 120. A trench between a neighboring pair of the plurality of memory cells 120 may have a height to width ratio (i.e., an aspect ratio) in a range from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to an upper surface of the substrate 100. In some implementations, neighboring trenches may be spaced substantially equidistant from each other. For example, a first pair of trenches neighboring each other in a first direction (e.g., the first direction of FIG. 1) may be spaced apart from each other by substantially the same distance as a second pair of trenches neighboring each other in a second direction (e.g., the second direction of FIG. 1). In some implementations, distances between the neighboring trenches may vary.

Figure 2B:
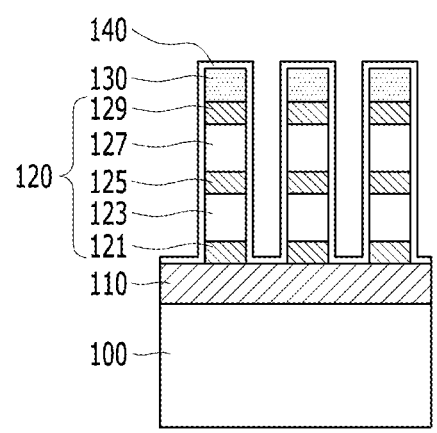

Referring to FIG. 2B, a capping layer 140 for protecting the memory cells 120 may be formed along the structure illustrated in FIG. 2A. The capping layer 140 may be formed along sidewalls of the memory cells 120 and sidewalls and upper surfaces of the hard mask patterns 130. The capping layer 140 may have a single-layer structure or a multi-layer structure, and include an insulating material such as a silicon nitride. In some implementations, the capping layer 140 may be omitted.

Figure 2C:
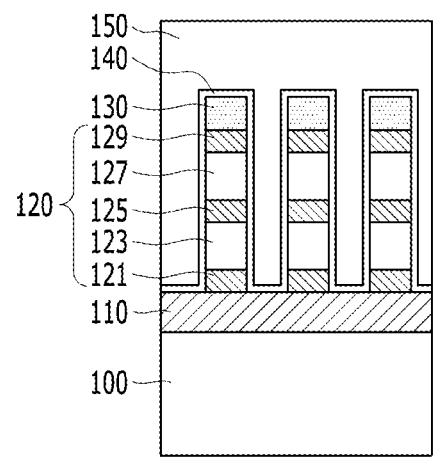

Referring to FIG. 2C, a flowable dielectric layer 150 may be formed over the capping layer 140.

The flowable dielectric layer 150 may be formed by depositing one or more flowable dielectric materials which can be deposited by a flowable chemical vapor deposition (FCVD) process. The FCVD process may include, for example, a remote plasma enhanced chemical vapor deposition (RPECVD) process. A treatment temperature during the RPECVD process may be maintained at a sufficiently low value to maintain flowability of the flowable dielectric layer 150.

A material for forming the flowable dielectric layer 150 may include a material, which can be converted into an oxide-based dielectric layer, a nitride-based dielectric layer, or a carbide-based dielectric layer by a subsequent curing process. In some implementations, the flowable dielectric layer 150 may be formed using a silicon-containing compound. A suitable silicon-containing compound may be a compound, which can be polymerized by a plasma polymerization reaction and include organic silane and organic siloxane. For example, the silicon-containing compound may include any of trisilylamine (TSA), tetraoxymethylcyclotetrasiloxane (TOMCTS), octamethylcyclotetrasiloxane (OMCTS), tetraethoxysilane (TEOS), triethoxysilane (TES), trimethylsilane (TMS), methyltriethoxysilane (MTEOS), tetramethylorthosilicate (TMOS), methyltrimethoxysilane (MTMOS), dimethyldimethoxysilane (DMDMOS), diethoxysilane (DES), triphenylethoxysilane, 1-(triethoxysilyl)-2-(diethoxymethylsilyl)ethane, tris-t-butoxy silanol, tetramethoxysilane, and the like.

A reactive gas used for the deposition process of forming the flowable dielectric layer 150 may further include an oxidizing agent, in addition to the silicon-containing compound. The reactive gas may further include a catalyst in addition to the oxidizing agent.

The oxidizing agent may be an oxidizing agent that can react with the silicon-containing compound to form a flowable layer (e.g., the flowable dielectric layer 150). For example, the oxidizing agent used for the flowable dielectric layer 150 may include any of ozone, hydrogen peroxide, oxygen, water, alcohol, and the like.

The catalyst may catalyze and aid in the formation of the flowable layer (e.g., the flowable dielectric layer 150). For example, the catalyst may take the form of ionic species, which can be gasified and easily dissociated from each other, or ionized in order to catalyze the formation of the flowable dielectric layer 150. The catalyst may facilitate the deposition of the flowable dielectric layer 150 by improving one or more of cross-linkage, a reaction rate, and a substrate coverage. For example, the ionic species in the catalyst may include any of halogen ions ($F^-$, $Cl^-$, $Br^-$, etc.), oniums, and nucleophiles, such as ammonium ($NH_4^+$) and phosphonium ($PH_4^+$). Examples of materials that disassociate into oniums include $NH_4OH$, $NH_4OAc$, $NH_3$, $(CH_3)_4NOH$, $(CH_3)_4NOAc$, $PH_3$, and the like.

Reaction conditions for forming the flowable dielectric layer 150 may be adjusted such that the silicon-containing compound and one or both of the oxidizing agent and the catalyst, undergo a polymerization reaction to form the flowable dielectric layer 150 over the structure illustrated in FIG. 2B.

In an implementation, when the flowable dielectric layer 150 is formed using trisilylamine as the silicon-containing compound and $NH_3$ as the catalyst, a silazane $(SiH_2NH)_n$ layer may be formed through the deposition process. The silazane $(SiH_2NH)_n$ layer may include Si—N bonds and Si—H bonds. In this implementation, the silazane (SiH$_2$NH)$_n$ layer is the flowable dielectric layer 150.

After the flowable dielectric layer 150 is deposited, the flowable dielectric layer 150 may be characterized as a gel-like amorphous polymer exhibiting glass transition and having weak mechanical characteristics. In order to enhance such weak mechanical characteristics and strengthen the film quality of the flowable dielectric layer 150, a curing process may be performed on the flowable dielectric layer 150.

Figure 2D:
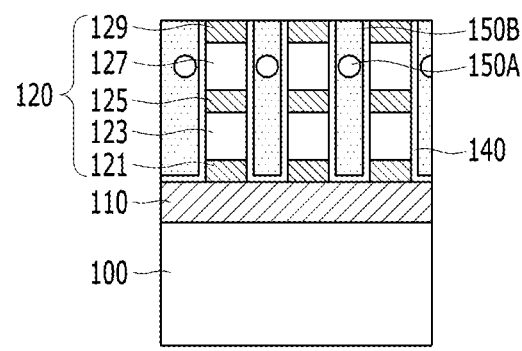

Referring to FIG. 2D, by performing an in-situ curing process on the flowable dielectric layer 150, the flowable dielectric layer 150 (e.g., a first dielectric layer) may solidify and contract so as to be converted into a substituted dielectric material layer (not shown). Subsequently, the substituted dielectric material layer (also referred to as a dielectric material layer) is planarized to form a substituted dielectric layer (e.g., a second dielectric layer) 150B.

In an implementation, the curing process may be performed by performing one or both of thermal annealing and plasma treatment.

The thermal annealing may be performed at a temperature of 300° C. or higher in an inert atmosphere using argon (Ar) or helium (He) gas, or in a potentially reactive atmosphere. In some implementations, the thermal annealing may be performed in an oxidizing atmosphere using any of O$_2$, N$_2$O, O$_3$, H$_2$O, H$_2$O$_2$, and the like.

The plasma treatment may be performed using non-active plasma or reactive plasma, for example, one or more of O$_2$, O$_3$, and other oxidizing agents. The plasma treatment may be performed at a temperature in a range from 0° C. to 550° C., and the upper limit of the temperature range may be determined by thermal burden at a particular process step. The plasma treatment may be performed at a pressure in a range from 0.1 Torr to 10 Torr.

In an implementation, by performing the curing process on the flowable dielectric layer 150, the Si—N bonds, the Si—H bonds, or both, which are contained in the flowable dielectric layer 150, may be reduced and the number of Si—O bonds in the flowable dielectric layer 150 may be increased. That is, by the curing process, the Si—N bonds, the Si—H bonds, or both in the flowable dielectric layer 150 may be substituted by the Si—O bonds. Therefore, in an implementation, the flowable dielectric layer 150 may be converted into the substituted dielectric material layer, and may include a stable oxide such as SiO$_2$.

In various implementations, the substituted dielectric material layer is formed by curing the flowable dielectric layer 150. The materials in the substituted dielectric material layer may depend on the materials used to form the flowable dielectric layer 150. In an implementation the substituted dielectric material layer includes a stable nitride such as a silicon nitride.

In another implementation, the substituted dielectric material layer includes a stable carbide such as a silicon carbide.

In accordance with an implementation, the substituted dielectric layer 150B may be formed by planarizing the substituted dielectric material layer. In the implementation shown in FIG. 2D, an unsubstituted dielectric layer (e.g., a third dielectric layer) 150A may be disposed adjacent to at least a portion of a side surface of the variable resistance layer 127. Specifically, the implementation shown in FIG. 2D includes a single unsubstituted dielectric layer 150A, which is disposed adjacent to the side surface of a corresponding variable resistance layer 127, but implementations of the present patent document are not limited thereto. For example, a plurality of unsubstituted dielectric layers 150A may be disposed adjacent to the side surface of the corresponding variable resistance layer 127. In some implementations, the unsubstituted dielectric layer 150A may be in contact with at least a portion of the capping layer 140. In some implementations without the capping layer 140, the unsubstituted dielectric layer 150A may be in contact with at least a portion of a side surface of the variable resistance layer 127. In the implementation shown in FIG. 2D, when the flowable dielectric layer 150 has been cured, the Si—N bonds, the Si—H bonds, or both in some portions of the flowable dielectric layer 150 may be substituted by the Si—O bonds to form the substituted dielectric material layer, which includes the substituted dielectric layers 150B. However, in the remaining portions of the flowable dielectric layer 150 adjacent to side surfaces of the variable resistance layers 127, the Si—N bonds, the Si—H bonds, or both are not substituted by the Si—O bonds. The portions of the flowable dielectric layer 150 that are unsubstituted by the Si—O bonds are the unsubstituted dielectric layers 150A.

That is, in the implementation shown in FIG. 2D, the substituted dielectric layer 150B may be referred to as a dielectric layer which is formed by replacing the Si—N bonds, the Si—H bonds, or both in the flowable dielectric layer 150 with the Si—O bonds by curing the flowable dielectric layer 150 and then planarizing the cured dielectric layer. On the other hand, each of the unsubstituted dielectric layers 150A may be referred to as a dielectric layer which is disposed adjacent to at least a portion of a side surface of the variable resistance layer 127 after the flowable dielectric layer 150 has been cured. Each of the unsubstituted dielectric layers 150A includes the Si—N bonds, the Si—H bonds, or both, which are not substituted by the Si—O bonds. The unsubstituted dielectric layers 150A may be formed by controlling conditions of the curing process.

The unsubstituted dielectric layer 150A may have greater porosity than the substituted dielectric layer 150B. Therefore, a density of the unsubstituted dielectric layer 150A may be lower than that of the substituted dielectric layer 150B.

Moreover, although the substituted dielectric layer 150B and the unsubstituted dielectric layer 150A may include the same constituent element, for example, silicon (Si), the substituted dielectric layer 150B may have a thermal conductivity that is different from the thermal conductivity of the unsubstituted dielectric layer 150A. In some implementations, the unsubstituted dielectric layer 150A may have a thermal conductivity lower than the thermal conductivity of the substituted dielectric layer 150B.

As such, each of the unsubstituted dielectric layers 150A has a relatively lower thermal conductivity and is disposed at a position adjacent to at least a portion of a side surface of the corresponding variable resistance layer 127. In order to prevent or reduce a thermal disturbance due to operation of adjacent memory cells 120, the thermal conductivity of oxides disposed between the adjacent memory cells 120 should be low. Since air has the lowest thermal conductivity, the thermal disturbance can be preferably prevented in case of forming air gaps between the memory cells 120. However, it is practically difficult to apply air gaps because air gaps cause various problems regarding integration. Therefore, in accordance with the implementation, each of the unsubstituted dielectric layers 150A with a relatively lower thermal conductivity is disposed at a position adjacent to a side surface of the corresponding variable resistance layer 127 so as to prevent or reduce the thermal disturbance due to operation of adjacent memory cells 120. As a result, in a semiconductor memory according to an implementation, a thermal disturbance on the memory cell 120 including the variable resistance layer 127 can be substantially prevented, and characteristics of the memory cell 120 can be improved.

In the implementation shown in FIG. 1, a single cross-point structure has been described. However, in another implementation, two or more cross-point structures may be stacked. In this case, the flowable dielectric layer 150 may be formed and then converted into the substituted dielectric material layer so as to fill the trenches, each of which has a relatively high aspect ratio and is substantially without defects, such as voids or seams. Therefore, the disclosed methods substantially prevent a bridge failure and improve an imbalance of thermal disturbances in the cross-point structures.

The position of the unsubstituted dielectric layer 150A may be located adjacent to at least a portion of a side surface of the variable resistance layer 127. The location of the unsubstituted dielectric layer 150A may be controlled by appropriately controlling conditions used to form the unsubstituted dielectric layer 150A and/or the variable resistance layer 127, in accordance with a specific manufacturing environment. For example, it is possible to locate the unsubstituted dielectric layer 150A adjacent to at least a portion of a side surface of the variable resistance layer 127 by controlling a dimension of the memory cells 120, a thickness of the flowable dielectric layer 150, deposition conditions of the flowable dielectric layer 150, and/or conditions for curing the flowable dielectric layer 150. Moreover, for example, the probability of occurrence of the unsubstituted dielectric layer 150A may be increased as a CD (critical dimension) of spaces between the memory cells 120 is decreased, a height of the memory cells 120 is increased, a thickness of the flowable dielectric layer 150 is increased, a flow rate of the silicon-containing compound such as trisilylamine is decreased and/or a temperature of curing is decreased. Further, the position of the unsubstituted dielectric layer 150A may be controlled by controlling the above parameters.

Subsequently, a planarization process may be performed on the substituted dielectric material layer (not shown) and the capping layer 140 until upper surfaces of the memory cells 120 are exposed, thereby forming the substituted dielectric material layer 150B. The planarization process may be performed by a chemical mechanical polishing (CMP) process, an etch process, a cleaning process, or any suitable planarization process. Since the planarization process is performed until the upper surface of the memory cells 120 is exposed, the hard mask pattern 130 may be also removed by the planarization process.

Figure 2E:
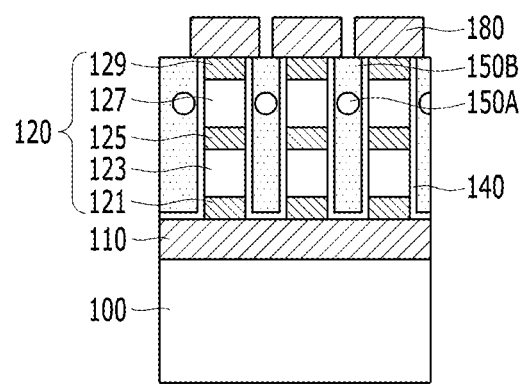

Referring to FIG. 2E, a plurality of second lines 180 may be formed over the memory cells 120, the capping layer 140, and the substituted dielectric layer 150B. The plurality of second lines 180 may be respectively coupled to the upper surfaces of the memory cells 120. Each of the plurality of second lines 180 extend in the second direction crossing the first direction. The second direction may be perpendicular to the line A-A' of FIG. 1. Each of the second lines 180 may have a single-layer structure or a multi-layer structure, and include a conductive material, such as any of a metal, a metal nitride, and the like. The second lines 180 may be formed by depositing a conductive material and patterning the deposited material. Spaces between neighboring second lines 180 may be filled with an insulating material (not shown).

Through the processes as described above, the semiconductor memory shown in FIG. 2E may be fabricated.

The semiconductor memory in accordance with the implementation shown in FIG. 2E may include the memory cells 120 disposed at intersection regions between the first lines 110 extending in the first direction and the second lines 180 extending in the second direction. Here, sidewalls of the memory cells 120 may be in direct contact with the insulating capping layer 140', and each of the unsubstituted dielectric layers 150A may be formed at a position adjacent to a portion of the sidewall of the variable resistance layer 127.

The memory cells 120 may store data having different values according to the voltage or current that is applied thereto through the first lines 110 and the second lines 180. In particular, when the memory cells 120 each include variable resistance elements, each of the memory cells 120 may store data by switching between different resistance states.

One of the first lines 110 may function as a word line and one of the second lines 180 may function as a bit line, and vice versa.

In the semiconductor memory of FIG. 2E fabricated by a method according to an implementation of the present disclosure, the unsubstituted dielectric layers 150A have not been substituted by, for example, Si—O bonds. Each of the unsubstituted dielectric layers 150A can be located adjacent to at least a portion of the side surface of the variable resistance layer 127 by appropriately controlling specific manufacturing conditions, for example, any of a dimension of the memory cells 120, a thickness of the flowable dielectric layer 150, deposition conditions of the flowable dielectric layer 150, and curing process conditions. The unsubstituted dielectric layers 150A may contribute to substantially preventing issues in the memory cells 120 by preventing a thermal disturbance on each memory cell 120, and therefore improve characteristics of the memory cells 120. Although, in the implementation of FIG. 2E, one cross-point structure has been described, two or more cross-point structures may be stacked in a vertical direction perpendicular to a top surface of the substrate 100. In this case, a space between the plurality of memory cells 120 may be filled with the flowable dielectric layer 150, and then some portions of the flowable dielectric layer 150 may be cured to be substituted by, for example, a stable oxide having the Si—O bonds. As a result, it is possible to substantially remove defects such as voids or seams, substantially prevent a bridge failure, and improve an imbalance of a thermal disturbance.

FIGS. 3A, 3B, 3C, 3D, 3E, and 3F are cross-sectional views illustrating a semiconductor memory and a method for fabricating the semiconductor memory in accordance with another implementation of the present disclosure. Detailed descriptions of substantially the same parts of the implementation described above with reference to FIGS. 2A to 2E will be omitted.

First, the method for fabricating the semiconductor memory will be explained below.

Figure 3A:
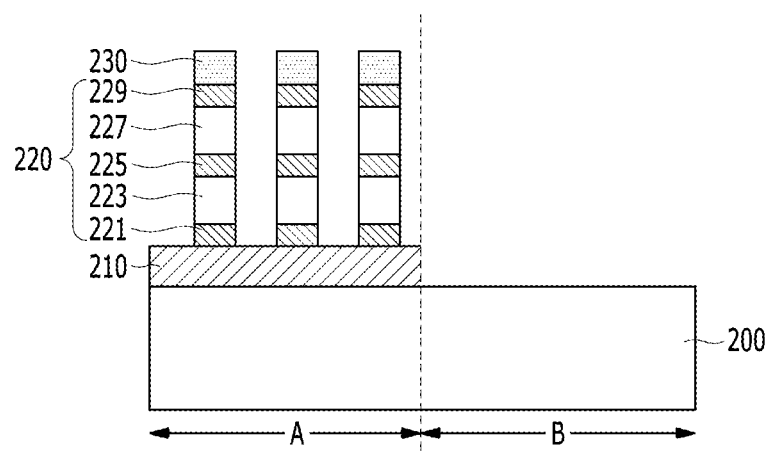
FIGS. 3A, 3B, 3C, 3D, 3E and 3F are cross-sectional views illustrating a semiconductor memory and a method for fabricating the semiconductor memory in accordance with another implementation of the present disclosure.

Referring to FIG. 3A, a substrate 200 including given structures (not shown) may be provided. A first region A includes a first portion of the substrate 200 and a second region B includes a second portion of the substrate 200.

Here, the first region A may be a memory cell region including a plurality of memory cells. The second region B may be disposed adjacent to the first region A and be a peripheral circuit region including one or more peripheral circuits. The given structures may be formed in one or both of the first region A and the second region B, and include a transistor, conductive lines, etc.

Then, over the substrate 200 in the first region A, first lines 210 each extending in a first direction, memory cells 220, and hard mask patterns 230 disposed over the memory cells 220, may be formed. Each of the memory cells 220 includes a lower electrode layer 221, a selection element layer 223, a middle electrode layer 225, a variable resistance layer 227, and an upper electrode layer 229, which are sequentially stacked and disposed over each corresponding one of the first lines 210. Since the first lines 210, the memory cells 220, and the hard mask patterns 230 are substantially the same as corresponding elements of the implementation described above with reference to FIG. 2A, detailed descriptions of these elements and a method of forming the elements will be omitted.

Figure 3B:
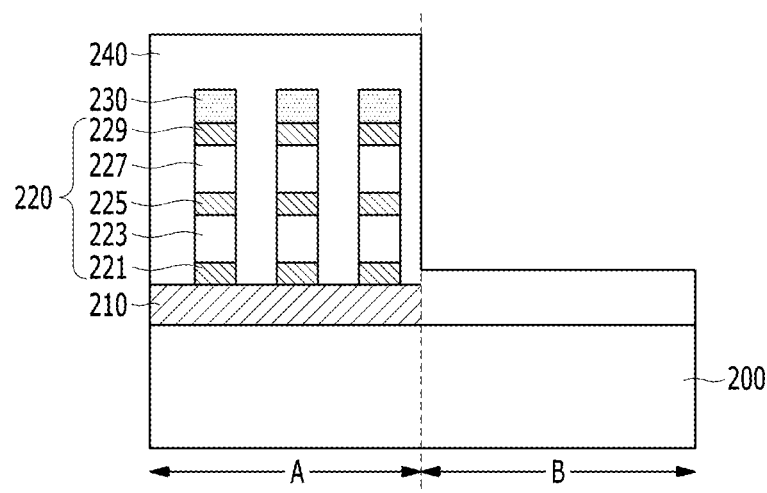

Referring to FIG. 3B, a flowable dielectric layer 240 may be formed over a resultant structure of FIG. 3A. The flowable dielectric layer 240 may be formed over a lower profile of the semiconductor memory. Specifically, the flowable dielectric layer 240 may be formed over top surfaces of the first lines 210, side surfaces and top surfaces of the memory cells 220, and a top surface of the substrate 200. Therefore, a first portion of a top surface of the flowable dielectric layer 240 in the first region A may be spaced apart from the top surface of the substrate 200 by a first distance, which is greater than a second distance by which a second portion of the top surface of the flowable dielectric layer 240 in the second region B is spaced apart from the top surface of the substrate 200. A third portion of the top surface of the flowable dielectric layer 240 may transition between two levels of the first and second portions of the top surface of the flowable dielectric layer 240 with a non-parallel slope with respect to the top surface of the substrate 200, in an intermediate region including a boundary between the first region A and the second region B. For example, in the implementation shown in FIG. 3C, the third portion of the top surface of the flowable dielectric layer 240 at the boundary between the first region A and the second region B may be substantially perpendicular to the top surface of the substrate 200. Since a method of forming the flowable dielectric layer 240 is substantially the same as that according to the implementation described above with reference to FIG. 2C, the detailed descriptions are omitted.

Figure 3C:
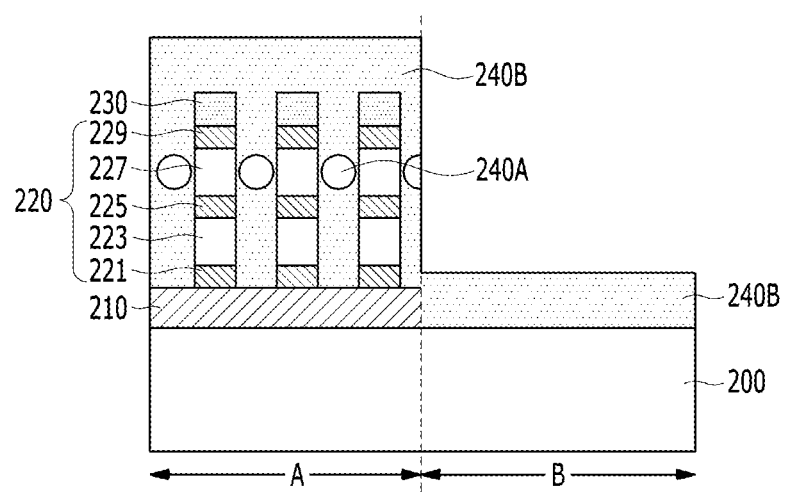

Referring to FIG. 3C, by performing an in-situ curing process on the flowable dielectric layer 240, for example, Si—N bonds, Si—H bonds, or both in the flowable dielectric layer 240 may be reduced and Si—O bonds may be increased. That is, by the curing process, the Si—N bonds the Si—H bonds, or both in the flowable dielectric layer 240 may be substituted by the Si—O bonds. Therefore, in an implementation, the flowable dielectric layer 240 may be converted into a substituted dielectric material layer 240B including a stable oxide such as $SiO_2$. At the same time, a plurality of unsubstituted dielectric layers 240A are formed, such that each of the unsubstituted dielectric layers 240A may be located adjacent to at least a portion of a side surface of the variable resistance layer 227 by appropriately adjusting one or more of a dimension of the memory cells 220, a thickness of the flowable dielectric layer 240, deposition conditions of the flowable dielectric layer 240, and curing process conditions according to the specific fabrication conditions. Each of the unsubstituted dielectric layers 240A may be a dielectric layer including bonds that are not substituted by the Si—O bonds, such as the Si—N bonds, the Si—H bonds, or both. In the implementation shown in FIG. 3C, each of the unsubstituted dielectric layers 240A is spaced apart from the side surface of the variable resistance layer 227, but implementations of the present patent document are not limited thereto. In an implementation, at least one the unsubstituted dielectric layer 240A may be in contact with at least a portion of the side surface of the variable resistance layer 227. Since the substituted dielectric material layer 240B and the unsubstituted dielectric layers 240A may be formed substantially the same as the implementation described above with reference to FIG. 2D, detailed descriptions are omitted.

Figure 3D:
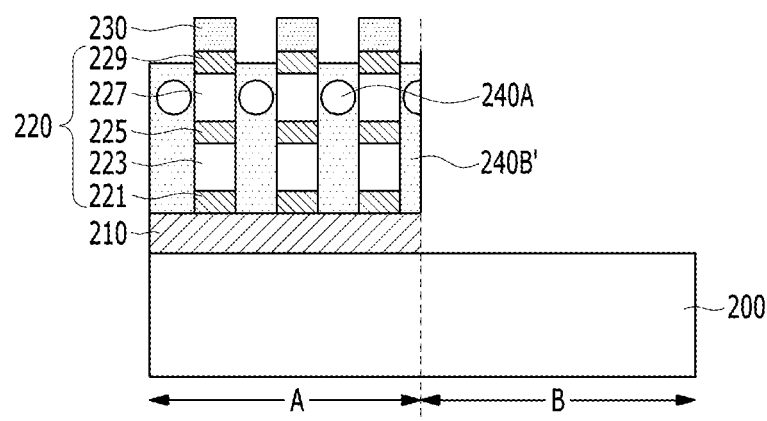

Referring to FIG. 3D, a substituted dielectric layer 240B' may be formed by removing a portion of the substituted dielectric material layer 240B in the second region B.

During forming a via or a contact in the second region B in a subsequent process, layers included in a stack should have the same critical dimension (CD) as each other so as to have a substantially uniform vertical profile. However, since the substituted dielectric material layer 240B has a poor property, a CD in the substituted dielectric material layer 240B may be increased (i.e. widening effect) in a contact etch process or a cleaning process. By removing the portion of the substituted dielectric material layer 240B in the second region B, however, it is possible to substantially prevent the widening effect due to the portion of the substituted dielectric material layer 240B when etching is performed to form a via or a contact in the second region B in a subsequent process. Further, implementations described in the present disclosure are relatively simple while improving processability and cost efficiency.

The portion of the substituted dielectric material layer 240B in the second region B may be removed by, for example, a wet etch process.

Meanwhile, during removing the portion of the substituted dielectric material layer 240B in the second region B, a portion of the substituted dielectric material layer 240B in the first region A may be also removed.

Figure 3E:
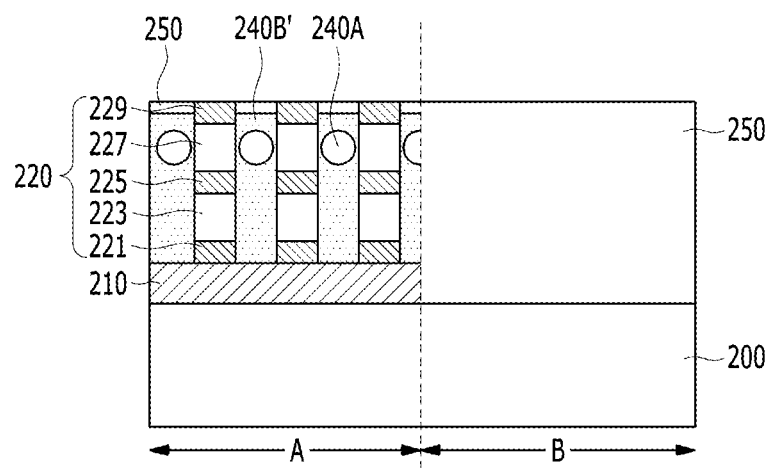

Referring to FIG. 3E, an interlayer dielectric material layer (not shown) may be formed over a resultant structure of FIG. 3D. The interlayer dielectric material layer may compensate for the portion of the substituted dielectric material layer 240B in the first region A that has been removed.

The interlayer dielectric material layer may have a single-layered structure or a multi-layered structure and include various insulating materials such as a silicon oxide, a silicon nitride, or a combination thereof. In some implementations, the interlayer dielectric material layer may include an ULTO (ultra-low-temperature oxide).

Then, a planarization process such as a CMP process may be performed on the interlayer dielectric material layer until top surfaces of the memory cells 220 are exposed to form an interlayer dielectric layer 250. Since, during this process, the planarization process is performed until the top surfaces of the memory cells 220 are exposed, the hard mask patterns 230 in FIG. 3D may be removed.

Figure 3F:
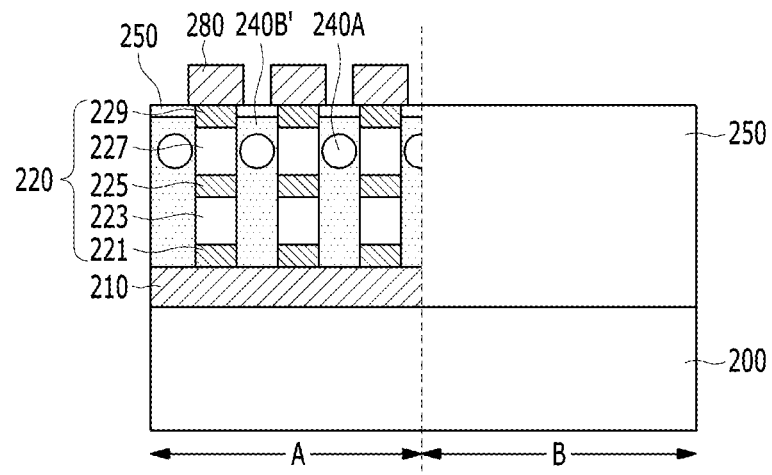

Referring to FIG. 3F, a plurality of second lines 280 respectively coupled to the top surfaces of the memory cells 220 and each extending in a second direction crossing the first direction may be formed over the memory cells 220 and the substituted dielectric layer 240B'. The second lines 280 may have a single-layered structure or a multi-layered structure, and may include a conductive material, such as a metal, a metal nitride, etc. The second lines 280 may be formed by depositing a conductive material and patterning the conductive material, and a space between the second lines 280 may be filled with an insulating material (not shown).

Through the processes described above, the semiconductor memory may be formed as illustrated in FIG. 3F.

The semiconductor memory in accordance with the implementation shown in FIG. 3F may include the substrate 200 and the plurality of memory cells 220, which are disposed over the substrate 200 in the first region A, which is adjacent to the second region B. The semiconductor memory further includes the first lines 210, which are disposed over the substrate 200 in the first region A and each extend in the first direction; the substituted dielectric layer 240B', which covers the first lines 210 in the first region A and is disposed between the plurality of memory cells 220; and the unsubstituted dielectric layers 240A, which are each disposed adjacent to at least a portion of a side surface of each corresponding one of the variable resistance layers 227 in the first region A. The semiconductor memory further includes the interlayer dielectric layer 250, which covers the substituted dielectric layer 240B' in the first region A and the substrate 200 in the second region B; and the second lines 280, which are coupled to the memory cells 220 in the first region A. The second lines 280 each extend in the second direction.

Each of the first lines 210 may function as a word line, and each of the second lines 180 may function as a bit line, and vice versa. Each of the memory cells 220 may store data according to a voltage or a current applied through a coupled word line and a coupled bit line.

Using the structure of the semiconductor memory, and the method for fabricating the semiconductor memory, in accordance with the implementation shown in FIG. 3F, it is possible to locate the unsubstituted dielectric layer 240A by appropriately controlling one or more of a dimension of the memory cells 220, a thickness of the flowable dielectric layer 240, deposition conditions of the flowable dielectric layer 240, and curing process conditions according to the specific fabricating conditions. The location of the unsubstituted dielectric layer 240A may substantially prevent deterioration of the memory cells 220 due to thermal disturbance, and therefore improve characteristics of the memory cells 220. Further, by removing the portion of the substituted dielectric material layer 240B formed over the second region B, it is possible to substantially prevent the widening effect. Therefore, implementations described in the present disclosure are relatively simple while improving processability and cost efficiency.

Meanwhile, although one cross-point structure has been described in the implementation shown in FIG. 3F, in the first region A of the above semiconductor memory, two or more cross-point structures may be stacked in a direction perpendicular to a top surface of the substrate 200 in the first region A. Each of the cross-point structures may include first lines 210, second lines 280, and memory cells 220 located at intersections between the first lines 210 and the second lines 280. In this case, a flowable dielectric layer 240 may fill a space between the plurality of memory cells 220. The flowable dielectric layer 240 may be subsequently cured and substituted by, for example, a stable oxide having Si—O bonds. Therefore, it is possible to substantially prevent a bridge failure and improve imbalance of thermal disturbance in each of the cross-point structures.

The above-described and other memory circuits or semiconductor devices based on the disclosed technology can be used in a range of devices or systems. FIGS. 4 to 8 provide some examples of devices or systems that can implement the memory circuits disclosed herein.

Figure 4:
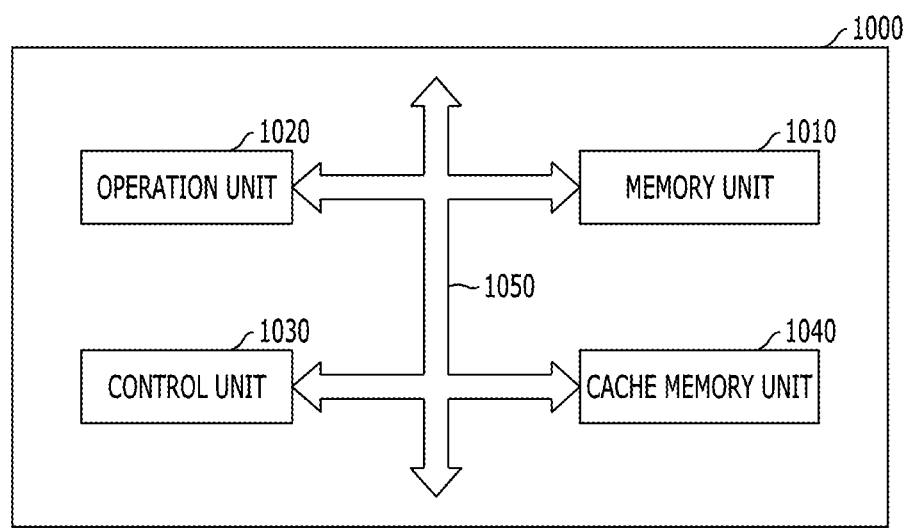
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of memory cells each including a variable resistance layer; a substituted dielectric layer filling a space between the plurality of memory cells; and an unsubstituted dielectric layer disposed adjacent to the variable resistance layer of each of the plurality of memory cells, wherein the unsubstituted dielectric layer may include a flowable dielectric material. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
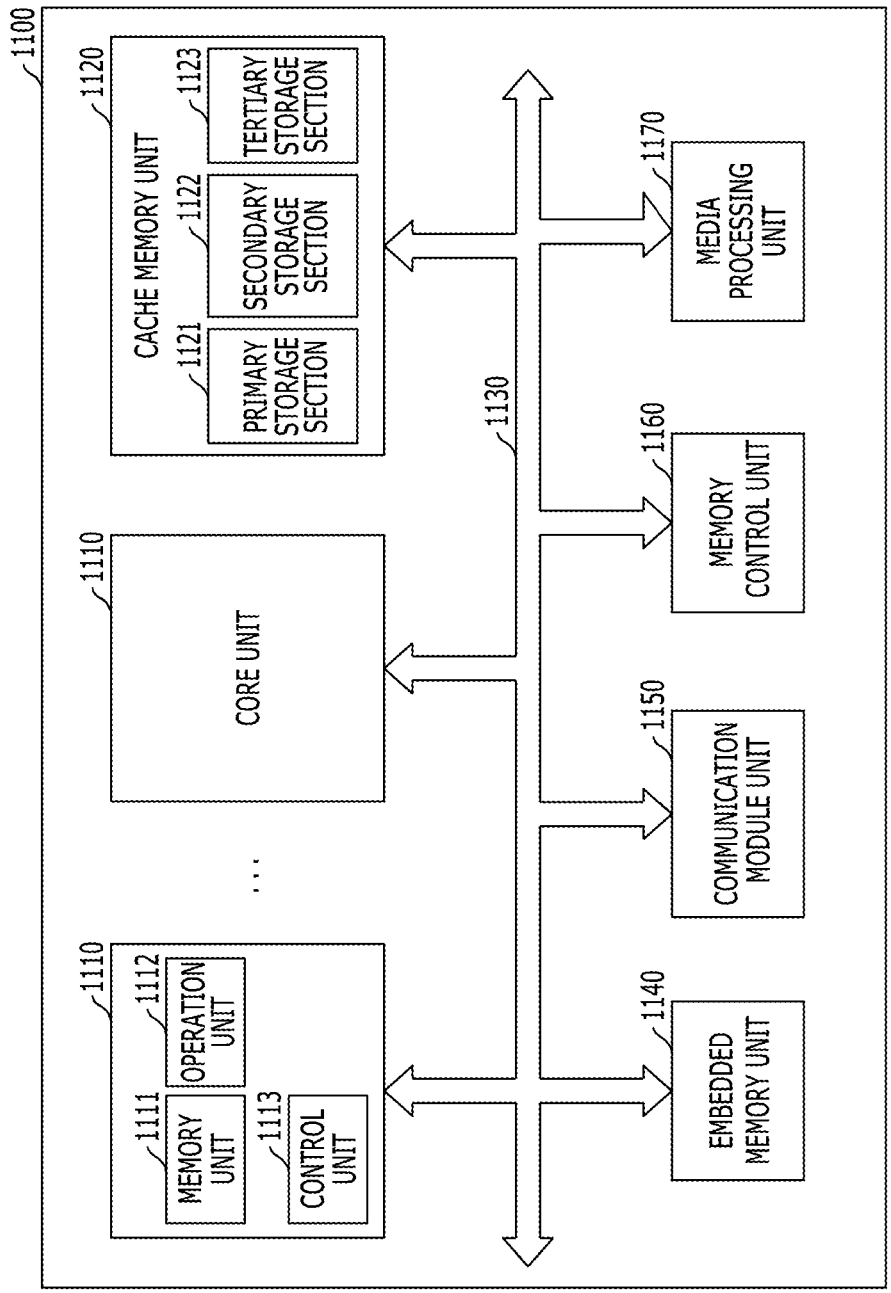
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of memory cells each including a variable resistance layer; a substituted dielectric layer filling a space between the plurality of memory cells; and an unsubstituted dielectric layer disposed adjacent to the variable resistance layer of each of the plurality of memory cells, wherein the unsubstituted dielectric layer may include a flowable dielectric material. Through this, data storage characteristics of the cache memory unit 1120 may be improved. As a consequence, operating characteristics of the processor 1100 may be improved.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
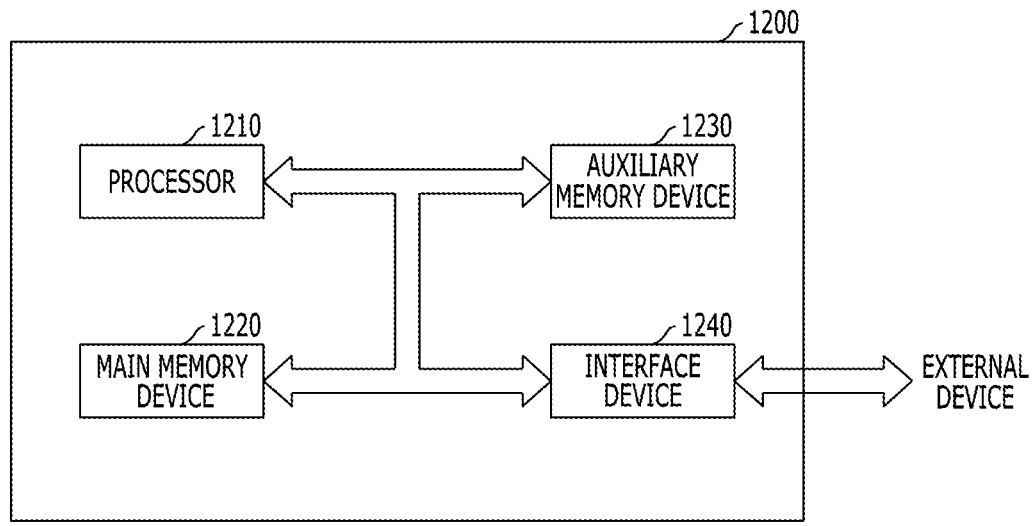
FIG. 6 is an example of configuration diagram of a system implementing memory circuitry based on the disclosed technology.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of memory cells each including a variable resistance layer; a substituted dielectric layer filling a space between the plurality of memory cells; and an unsubstituted dielectric layer disposed adjacent to the variable resistance layer of each of the plurality of memory cells, wherein the unsubstituted dielectric layer may include a flowable dielectric material. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of memory cells each including a variable resistance layer; a substituted dielectric layer filling a space between the plurality of memory cells; and an unsubstituted dielectric layer disposed adjacent to the variable resistance layer of each of the plurality of memory cells, wherein the unsubstituted dielectric layer may include a flowable dielectric material. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
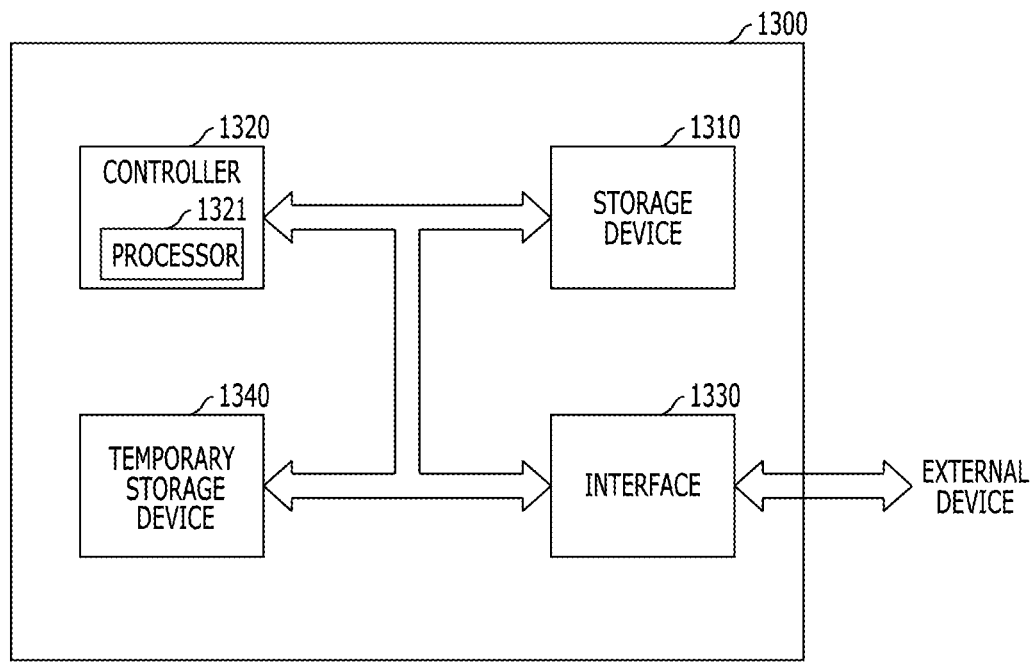
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of memory cells each including a variable resistance layer; a substituted dielectric layer filling a space between the plurality of memory cells; and an unsubstituted dielectric layer disposed adjacent to the variable resistance layer of each of the plurality of memory cells, wherein the unsubstituted dielectric layer may include a flowable dielectric material. Through this, data storage characteristics of the storage device 1310 or the temporary storage device 1340 may be improved. As a consequence, operating characteristics and data storage characteristics of the data storage system 1300 may be improved.

Figure 8:
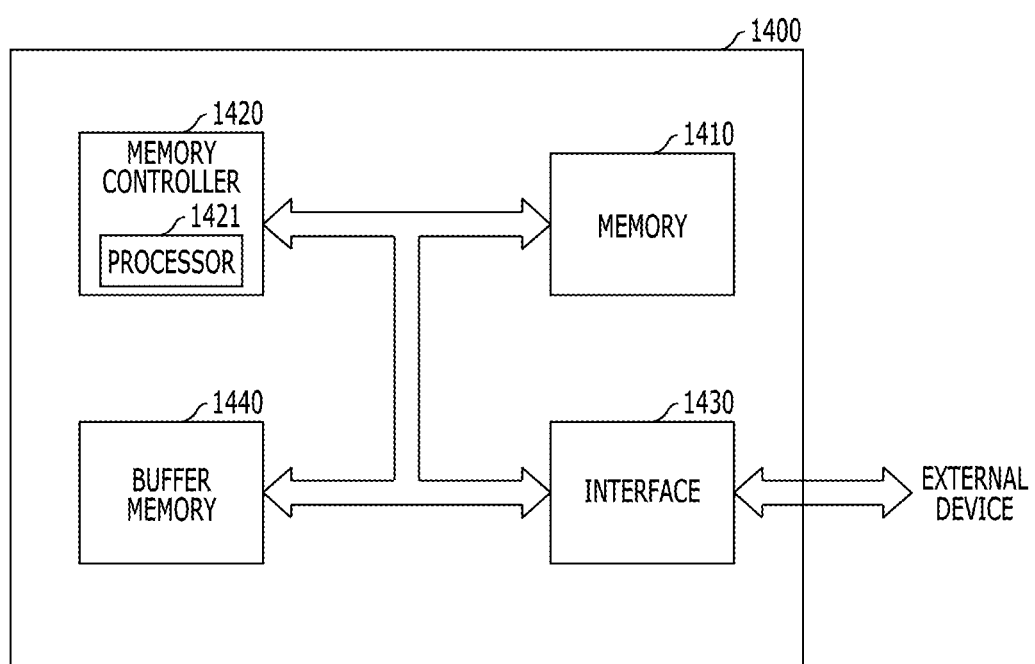
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of memory cells each including a variable resistance layer; a substituted dielectric layer filling a space between the plurality of memory cells; and an unsubstituted dielectric layer disposed adjacent to the variable resistance layer of each of the plurality of memory cells, wherein the unsubstituted dielectric layer may include a flowable dielectric material. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of memory cells each including a variable resistance layer; a substituted dielectric layer filling a space between the plurality of memory cells; and an unsubstituted dielectric layer disposed adjacent to the variable resistance layer of each of the plurality of memory cells, wherein the unsubstituted dielectric layer may include a flowable dielectric material. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
    a plurality of memory cells each including a variable resistance layer;
    a plurality of first lines disposed over a substrate and under the memory cells, each of the plurality of lines extending in a first direction;
    a plurality of second lines disposed over the memory cells, each of the plurality of second lines extending in a second direction that crosses the first direction, each of the memory cells being disposed at respective intersections of the first lines and the second lines;
    an unsubstituted dielectric layer disposed in a portion of a space between the plurality of memory cells, the portion of the space being adjacent to the variable resistance layer of each of the plurality of memory cells;
    a substituted dielectric layer filling a remaining portion of the space between the plurality of memory cells,
    wherein the unsubstituted dielectric layer includes a flowable dielectric material and is spaced apart from the first lines and the second lines.

2. The electronic device of claim 1, wherein the substituted dielectric layer includes Si—O bonds, and the unsubstituted dielectric layer includes Si—N bonds, Si—H bonds, or both, and
    wherein the space between the plurality of memory cells includes a plurality of trenches, each of the trenches being disposed between neighboring memory cells.

3. The electronic device of claim 1, wherein the substituted dielectric layer includes $SiO_2$, and the unsubstituted dielectric layer includes silazane $((SiH_2NH)_n)$.

4. The electronic device of claim 1, wherein each of the plurality of memory cells includes a material having a variable resistance characteristic, the material being a phase-change material or including a metal oxide.

5. The electronic device of claim 1, wherein each of the memory cells further includes a selection element layer controlling access to the variable resistance layer.

6. The electronic device of claim 1, wherein the semiconductor memory further includes a capping layer disposed on at least a side surface of one or more of the memory cells.

7. The electronic device of claim 1, wherein the entire unsubstituted dielectric layer is disposed between a top surface of the variable resistance layer and a bottom surface of the variable resistance layer, each of the top surface and the bottom surface being substantially parallel to a plane defined by the first direction and the second direction.

* * * * *